US011862601B2

(12) United States Patent
Kim et al.

(10) Patent No.: US 11,862,601 B2
(45) Date of Patent: Jan. 2, 2024

(54) DISPLAY DEVICE AND METHOD OF MANUFACTURING THE SAME

(71) Applicant: Samsung Display Co., LTD., Yongin-si (KR)

(72) Inventors: Min Sung Kim, Suwon-si (KR); Myong-Soo Oh, Asan-si (KR); Jun O Song, Jeollabuk-do (KR); Hee Jong Shin, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/866,915

(22) Filed: Jul. 18, 2022

(65) Prior Publication Data

US 2022/0352117 A1 Nov. 3, 2022

Related U.S. Application Data

(62) Division of application No. 17/038,682, filed on Sep. 30, 2020, now Pat. No. 11,410,966.

(30) Foreign Application Priority Data

Oct. 23, 2019 (KR) .......... 10-2019-0132055

(51) Int. Cl.
*H01L 23/00* (2006.01)
*G02F 1/1345* (2006.01)
*H10K 50/84* (2023.01)
*G02F 1/13* (2006.01)
*H10K 50/805* (2023.01)
*H10K 71/00* (2023.01)

(52) U.S. Cl.
CPC ............ *H01L 24/83* (2013.01); *G02F 1/1309* (2013.01); *G02F 1/13452* (2013.01); *H01L 24/32* (2013.01); *H10K 50/805* (2023.02); *H10K 50/846* (2023.02); *H01L 2224/32225* (2013.01); *H01L 2224/8392* (2013.01); *H01L 2224/83914* (2013.01); *H01L 2224/83939* (2013.01); *H10K 71/861* (2023.02)

(58) Field of Classification Search
CPC . H01L 4/32; H01L 24/83; H01L 2224/32225; H10K 50/846; H10K 50/805; H10K 71/861; G02F 1/1309
USPC .................. 257/773; 438/618, 666
See application file for complete search history.

(56) References Cited

U.S. PATENT DOCUMENTS

2013/0342779 A1  12/2013 Jung et al.
2016/0218151 A1* 7/2016 Kwon et al. .......... H01L 27/323

FOREIGN PATENT DOCUMENTS

KR   10-1134897   4/2012

* cited by examiner

*Primary Examiner* — Thinh T Nguyen
(74) *Attorney, Agent, or Firm* — KILE PARK REED & HOUTTEMAN PLLC

(57) ABSTRACT

A method for manufacturing a display device includes checking a particle positioned between a display panel and a connecting member, irradiating a laser to an upper surface of the connecting member overlapping at least a part of the particle, removing the connecting member overlapping a region to which the laser is irradiated, removing the particle overlapping a region to which the laser is irradiated, and disposing a desiccant in a hole formed by removing the connecting member and the particle.

4 Claims, 16 Drawing Sheets

DISPLAY DEVICE AND METHOD OF MANUFACTURING THE SAME

CROSS-REFERENCE TO RELATED APPLICATION(S)

This is a divisional application of U.S. patent application Ser. No. 17/038,682 filed Sep. 30, 2020 (now pending), the disclosure of which is incorporated herein by reference in its entirety. U.S. patent application Ser. No. 17/038,682 claims priority to and benefits of Korean Patent Application No. 10-2019-0132055 under 35 U.S.C. § 119, filed on Oct. 23, 2019 in the Korean Intellectual Property Office, the entire contents of which are incorporated herein by reference.

BACKGROUND

1. Technical Field

Embodiments relate generally to a display device and a method of manufacturing the same. Embodiments relate to the display device from which a particle is removed and the method of manufacturing the same.

2. Description of the Related Art

Generally, a display device may include a display panel and a driving unit. The display panel may be divided into a display area and a non-display area. To display an image in the display area, pixels electrically connected to data lines and gate lines may be disposed in the display area. To provide signals generated from a driving unit to the pixels, pads which may be provided with the signals may be disposed in the non-display area. In other words, the signals from the driving unit may be provided to the pads, and may be provided to the data lines (or, the gate lines). Meanwhile, the display device may include a connecting member (for example, a flexible printed circuit board) electrically connecting the driving unit and the pads, and a circuit pattern may be formed on the connecting member to transfer the signals. The pads and the connecting member may be adhered by an adhesive member having a conductivity. The signals may be generated from the driving unit, and may be provided to the pixels through the connecting member, the adhesive member, and the pads.

Meanwhile, an unintentional particle may be positioned between the pads and the connecting member. The particle may be caused by various factors. For example, the particle may be a piece that became separated from the pads during a process of patterning the pads. On the other hand, the particle may penetrate the display device from the outside during a manufacturing process of the display device. When the particle overlaps two adjacent pads among the pads, a short may occur between the two adjacent pads, resulting in the particle causing a signal transmission defect.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a method of manufacturing a display device including a process of removing a particle.

Embodiments provide a display device from which a particle may be removed.

According to an embodiment, a method for manufacturing a display device may include checking a particle positioned between a display panel and a connecting member, wherein the display panel may include pads spaced apart from each other and the connecting member may be formed on the pads, irradiating a laser to an upper surface of the connecting member overlapping at least a part of the particle, removing the connecting member overlapping a region to which the laser is irradiated, removing the particle overlapping a region to which the laser is irradiated, and disposing a desiccant in a hole formed by removing the connecting member and the particle.

In an embodiment, the particle may include a conductive material.

In an embodiment, the method may further include determining whether the particle overlaps two adjacent pads among the pads after the checking of the particle.

In an embodiment, the irradiating of the laser may comprise irradiating the laser to the particle overlapping a space where the two adjacent pads may be spaced apart from each other.

In an embodiment, the method may further include disposing an adhesive member between the pads and the connecting member before the checking of the particle.

In an embodiment, the particle may be positioned between the connecting member and the adhesive member.

In an embodiment, the particle may be positioned between the adhesive member and the display panel. The method may further comprise removing the adhesive member overlapping a region to which the laser is irradiated.

In an embodiment, the removing of the connecting member and the removing of the particle may include removing the connecting member overlapping the region to which the laser is irradiated by irradiating the laser with a first output, removing the adhesive member overlapping the region to which the laser is irradiated by irradiating the laser with a second output, and removing the particle overlapping the region to which the laser is irradiated by irradiating the laser with a third output.

In an embodiment, the first output and the second output may be identical, and the first output may be greater than the third output.

In an embodiment, the method may further include injecting air into the hole formed by removing the connecting member and the particle after the removing of the connecting member and the removing of the particle.

In an embodiment, the disposing of the desiccant may include spraying the desiccant to the hole.

In an embodiment, the disposing of the desiccant may include filling the desiccant inside of the hole.

In an embodiment, the method may further include irradiating an ultraviolet-ray to the desiccant after the disposing of the desiccant to the hole.

In an embodiment, the method may further include checking whether the particle overlapping the region to which the laser is irradiated is removed, and re-irradiating the laser when the particle is not removed In an embodiment, the laser may be a femtosecond laser.

In an embodiment, the display panel may include a first substrate and a second substrate facing the first substrate, the pads may be formed on side surfaces of the first and second substrates, and the side surfaces of the first and second substrates and the upper surface of the connecting member may be parallel to each other.

According to an embodiment, a display device may include a first substrate including a plurality of regions, pads disposed on the first substrate and disposed in odd-numbered regions among the plurality of the regions, a connecting member disposed on the pads and including a first hole formed in at least one of even-numbered regions among the plurality of the regions, an adhesive member disposed between the pads and the connecting member and including a second hole connected to the first hole, and a desiccant disposed on the first hole.

In an embodiment, the desiccant may completely cover an upper surface of the first hole, and insides of the first and second holes may be empty.

In an embodiment, the desiccant may completely cover an upper surface of the first hole, and the desiccant may be filled in the first and second holes.

In an embodiment, the display device may further include a second substrate facing the first substrate, the pads may be disposed on side surfaces of the first and second substrates, and the side surfaces of the first and second substrates and an upper surface of the connecting member may be parallel to each other Therefore, in a method of manufacturing a display device according to embodiments, since a laser is irradiated to an upper surface of a connecting member, a particle overlapping a region to which the laser is irradiated may be removed. Since the particle of the display device is removed through the method, a defect such as a short between pads may be prevented. Since the laser is irradiated to the upper surface of the connecting member, the laser may not transmit through a substrate. Therefore, the method may be applied to display devices having various structures. Furthermore, since a desiccant is coated to the region where the connecting member and the particle may be removed, a penetration of air or moisture may be prevented.

Therefore, a display device according to an embodiment may improve display quality since a particle overlapping between the pads may be removed. A non-display area may be reduced since the pads of the display device may be disposed on side surfaces of first and second substrates.

BRIEF DESCRIPTION OF THE DRAWINGS

Illustrative, non-limiting embodiments will be more clearly understood from the following detailed description in conjunction with the accompanying drawings in which.

DETAILED DESCRIPTION OF THE EMBODIMENTS

Figure 1:
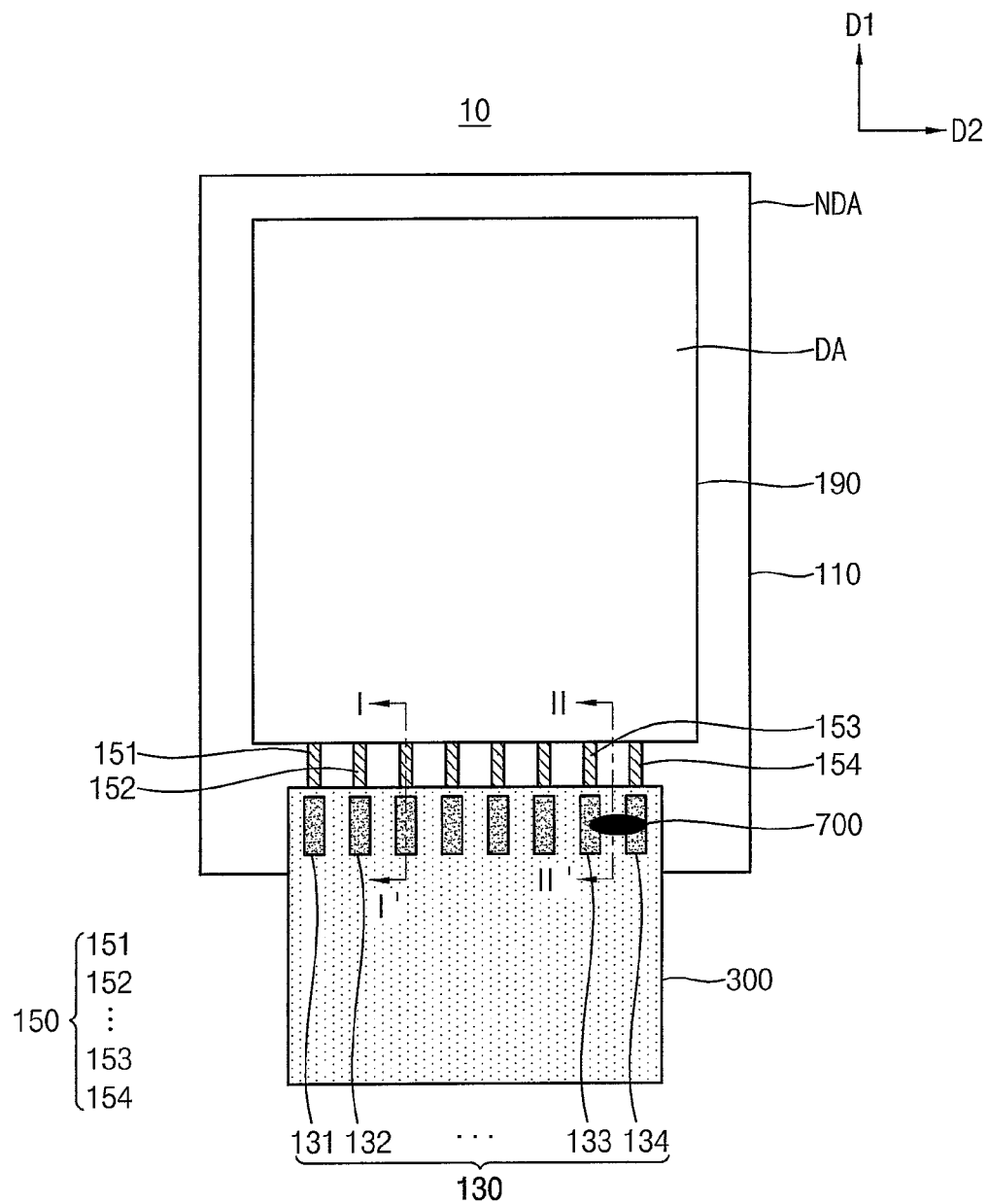
FIG. 1 is a plan view illustrating a display device according to an embodiment.

Hereinafter, embodiments will be explained in detail with reference to the accompanying drawings.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although the terms "first," "second," etc. may be used herein to describe various components, these components should not be limited by these terms. These components are only used to distinguish one component from another. For example, a first element referred to as a first element in one embodiment may be referred to as a second element in another embodiment without departing from the scope of the appended claims.

As used herein, the singular forms "a," "an" and "the" are intended to include the plural forms as well, unless the context clearly indicates otherwise.

It will be further understood that the terms "comprises" and/or "comprising" "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations Sizes of components in the drawings may be exaggerated for convenience of explanation. In other words, since sizes and thicknesses of components in the drawings are arbitrarily illustrated for convenience of explanation, the following embodiments are not limited thereto.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In the specification, an expression such as "A and/or B" indicates A, B, or A and B. Also, an expression such as "at least one of A and B" indicates A, B, or A and B.

In embodiments below, when a component is referred to as being "on a plane," it is understood that a component is viewed from the top, and when a component is referred to as being "on a schematic cross section," it is understood that the component is vertically cut and viewed from the side.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" or "electrically coupled" to another layer, region, or component, it may be "directly electrically connected" or "directly electrically coupled" to the other layer, region, or component and may be "indirectly electrically connected" or "indirectly electrically coupled" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view illustrating a display device according to an embodiment.

Referring to FIG. 1, the display device 10 may include a display panel and a connecting member 300. The display panel may include a display area DA and a non-display area NDA. For example, the display panel may have a substantially rectangular shape having a long side in a first direction D1 and a short side in a second direction D2 substantially perpendicular to the first direction D1. A display area DA may be disposed in a central portion of the display panel, and the non-display area NDA may be disposed to surround or be adjacent to the display area DA. However, a shape of the display panel is not limited thereto.

An image may be displayed in the display area DA. For example, a pixel that may display the image may be disposed in the display area DA. Signals generated from an external device may be provided to the pixel, and the pixel may emit light having a predetermined color (for example, a red color, a green color, or a blue color).

Pads 130 to which the signals generated from the external device may be applied may be disposed in the non-display area NDA so that the signals may be provided to the pixel. The pads may include a metal material such as silver (Ag). For example, the pads may be disposed on a lower portion of the display panel. Each of the pads may be arranged or disposed to be spaced apart from each other with a constant width along the second direction D2 in a plan view. Accordingly, spaces in which the pads 130 may be spaced apart from each other may also be arranged or disposed in the second direction D2.

The connecting member 300 may be disposed on the pads 130, and may be electrically connected to the pads 130. The connecting member 300 may transfer the signals provided from the external device to the pads 130. For example, circuit patterns that may transfer the signals to the pads may be formed or disposed on the connecting member 300. The connecting member 300 may include a flexible printed circuit board.

Figure 2:
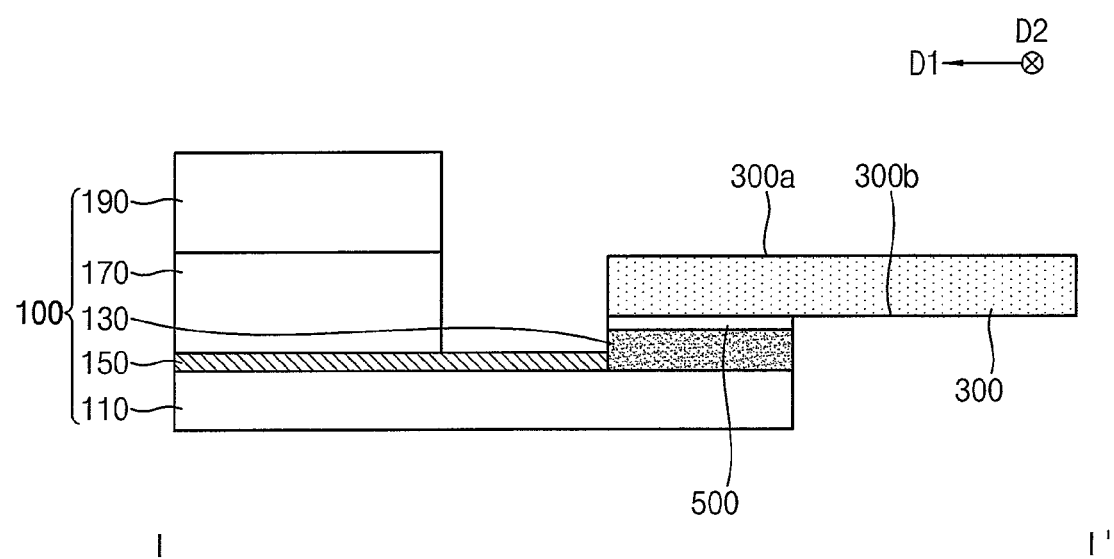
FIG. 2 is a schematic cross-sectional view taken along line I-I' of FIG. 1.

FIG. 2 is a schematic cross-sectional view taken along line I-I' of FIG. 1.

Referring to FIGS. 1 and 2, the display device 10 may include a display panel 100, a connecting member 300, and an adhesive member 500. The display panel 100 may include a first substrate 110, the pads 130, wires 150, a second substrate 170, and a polarizing plate 190.

The first substrate 110 may include a transparent material or an opaque material. The first substrate 110 may include first to (n)th (where n is an integer of 3 or more) regions arranged or disposed along the second direction D2. For example, the first substrate 110 may include a quartz substrate or a glass substrate. On the other hand, the first substrate 110 may include a plastic substrate having flexibility. The plastic substrate may be a polyimide substrate, and the first substrate 110 may have a structure in which at least one polyimide layer and at least one barrier layer may be alternately stacked.

The pads 130 may be disposed on the first substrate 110. The pads 130 may include first to fourth pads 131, 132, 133 and 134. For example, the pads 130 may be disposed on the lower portion of the display panel 100. For example, each of the pads 130 may be arranged or disposed to be spaced apart from each other with a constant width along the second direction D2 in a plan view. In other words, the pads 130 may be disposed in odd-numbered regions among the first to (n)th regions. The spaces in which the pads 130 may be spaced apart from each other may be disposed in even-numbered regions among the first to (n)th regions. The signals applied to the connecting member 300 may be provided to the pads 130.

The wires 150 may be disposed between the pixel and the pads 130. The wires 150 may include first to fourth wires 151, 152, 153 and 154. Each of the wires 150 may be arranged or disposed to be spaced apart from each other with a constant width along the second direction D2 in a plan view. The wires 150 may include a metal material such as copper (Cu). An insulating portion 140 (see FIG. 4) may be disposed between two adjacent wires. The wires 150 may be electrically connected to the pads 130, respectively, and may be extended in the first direction D1. For example, the first wire 151 may be electrically connected to the first pad 131, and may be extended in the first direction D1. Accordingly, the signals applied to the pads 130 may be provided to the wires 150, and may be provided to the pixel disposed in the display area DA. For example, the signals applied to the first pad 131 may be provided to the first wire 151. The signals may include various signals that may drive the display device 10. For example, the signals may include a power voltage, a gate signal, or a data voltage. Accordingly, the wires 150 may include a power voltage line, a gate line, or a data line.

The second substrate 170 may be disposed on the first substrate 110. For example, the second substrate 170 may be disposed to face the first substrate 110. The second substrate 170 may include a glass, a quartz, or a plastic. For example, when the display device 10 is a liquid crystal display ("LCD"), a liquid crystal layer may be disposed between the first substrate 110 and the second substrate 170. On the other hand, when the display device 10 is an organic light emitting display, an organic light emitting diode ("OLED") may be disposed between the first substrate 110 and the second substrate 170.

For example, the second substrate 170 may be a color filter substrate. For example, the second substrate 170 may include color filters, and each of the color filters may be a wavelength selective optical filter that selectively transmits only a portion of a wavelength band of a light incident to each color filter by transmitting a light in a specific wavelength band and blocking the light in another specific wavelength band. For example, the color filters may include a red color filter, a green color filter, and a blue color filter.

The polarizing plate 190 may be disposed on the second substrate 170. The polarizing plate 190 may transmit only an external light having a predetermined vibrating direction among external lights incident to the display device 10. Accordingly, the polarizing plate 190 may block the external lights incident on the display device 10 so that the external lights reflected from the display device 10 may be reduced.

The connecting member 300 may be disposed on the first substrate 110. For example, the pads 130 may be disposed in the non-display area NDA of the first substrate 110, and the connecting member 300 may be disposed on the pads 130. The connecting member 300 may include an upper surface 300a and a rear surface 300b. The rear surface 300b may face an upper surface of the first substrate 110, and the upper surface 300a of the connecting member 300 may be opposite to the rear surface 300b of the connecting member 300.

The connecting member 300 may be electrically connected to the pads 130. In detail, the connecting member 300 may provide the signals generated from the external device to the pads 130. For example, circuit patterns may be formed on the connecting member 300.

The adhesive member 500 may be disposed between the pads 130 and the connecting member 300. The adhesive member 500 may include a conductive material. For example, the adhesive member 500 may be an anisotropic conducting film ("ACF"). The ACF may include an adhesive cured by heat and conductive particles. When a pressure is applied to the ACF, the adhesive may be spread so that the conductive particles may be exposed to a surface of the ACF. Accordingly, the ACF may concurrently have a conductivity and an adhesiveness. Therefore, the signals provided to the adhesive member 500 through the connecting member 300 may be provided to the pads 130.

The signals may be generated from the external device, and may be provided to the pixel through the connecting member 300, the adhesive member 500, the pads 130, and the wires 150. The spaces spaced apart from each other in the second direction D2 may be located or disposed between two adjacent pads among the pads 130 so that each of the pads 130 may be insulated from each other. Accordingly, the signals may be provided to the pads 130, respectively. For example, a first signal applied to the connecting member 300 may be provided to the first pad 131, and a second signal, which may be applied to the connecting member 300, different from the first signal may be provided to the second pad 132. Therefore, the first signal may be provided to the first wire 151, and the second signal may be provided to the second wire 152.

Meanwhile, a particle 700 may be positioned between the display panel 100 and the connecting member 300. The particle 700 may be a piece that may be separated from the pads 130 in a process of patterning the pads 130, or may penetrate the display device 10 from an outside of the display device 10 during a process of manufacturing the display device 10. For example, the particle 700 may include a conductive material. In a case that the particle 700 includes the conductive material, the particle 700 may have a conductivity. For example, when the particle 700 overlaps two adjacent pads among the pads 130, a short may occur between the two adjacent pads. Here, the particle 700 may overlap the two adjacent pads in a plan view. For example, as shown in FIG. 1, the particle 700 may overlap the third and fourth pads 133 and 134. For example, the particle 700 may be positioned or disposed between the connecting member 300 and the adhesive member 500 in schematic cross-section view as shown in FIG. 4, or may be positioned or disposed between the adhesive member 500 and the pads 130 in schematic cross-section view as shown in FIG. 5.

In a case that the display device 10 includes the particle 700 as described above, a short may occur between pads overlapping the particle 700. Accordingly, the signals may not be provided to the pads where the short occurs. For example, in a case that the particle 700 is positioned or disposed between the third and fourth pads 133 and 134, a defect in which third and fourth signals may be provided to the third pad 133 may occur, or a defect in which the third and fourth signals may be provided to the fourth pad 134 may occur.

Figure 3:
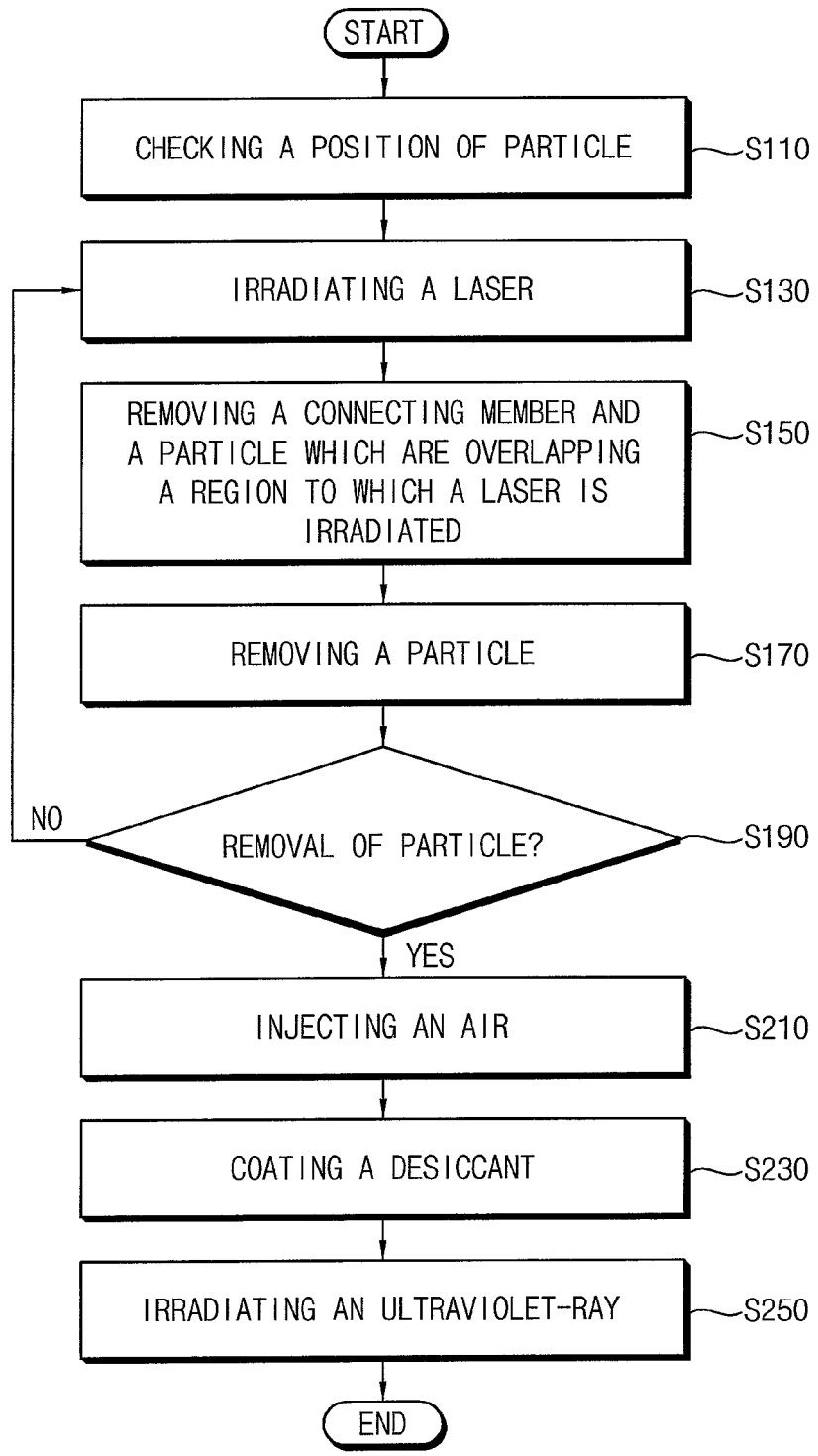
FIG. 3 is a flowchart illustrating a method of manufacturing a display device according to an embodiment.
Figure 12:
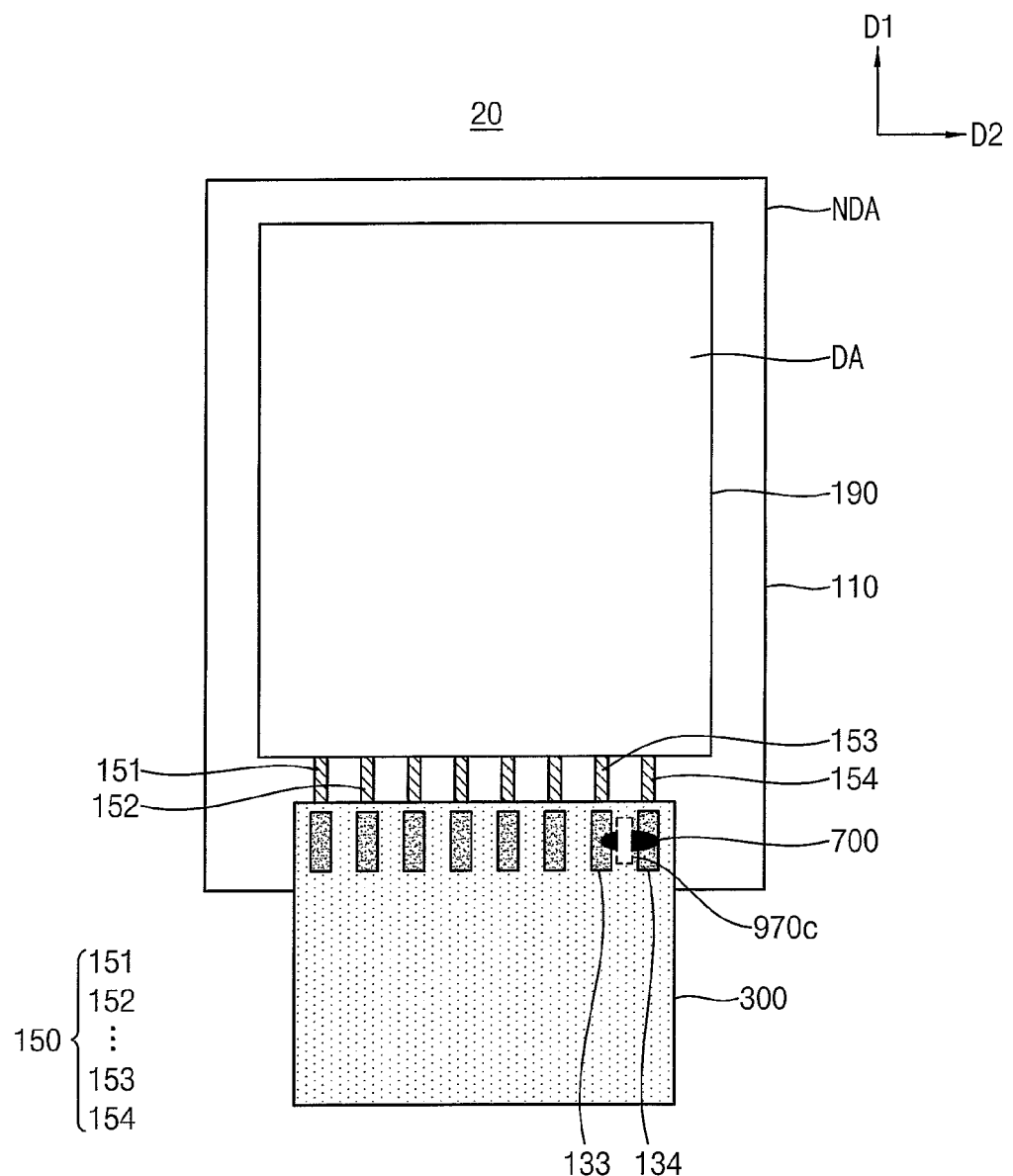
FIG. 12 is a plan view illustrating the display device according to an embodiment.

FIG. 3 is a flowchart illustrating a method of manufacturing a display device according to an embodiment. FIG. 4 to FIG. 11B are schematic cross-sectional views illustrating a method of manufacturing a display device according to an embodiment. FIG. 12 is a plan view illustrating the display device according to an embodiment. For example, FIG. 4 to FIG. 11B are schematic cross-sectional views of an embodiment.

Figure 4:
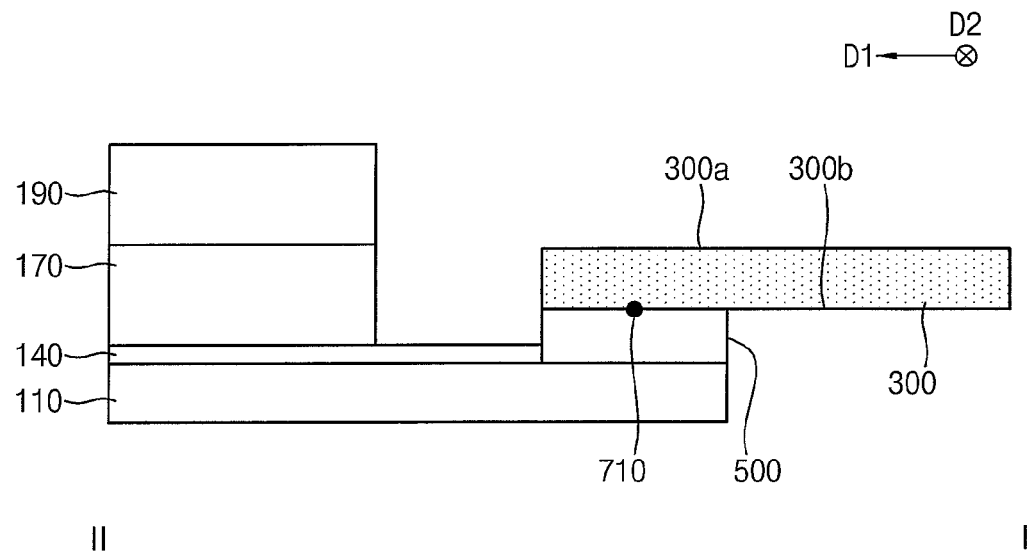
FIG. 4 to FIG. 11B are schematic cross-sectional views illustrating a method of manufacturing a display device according to an embodiment.
Figure 5:
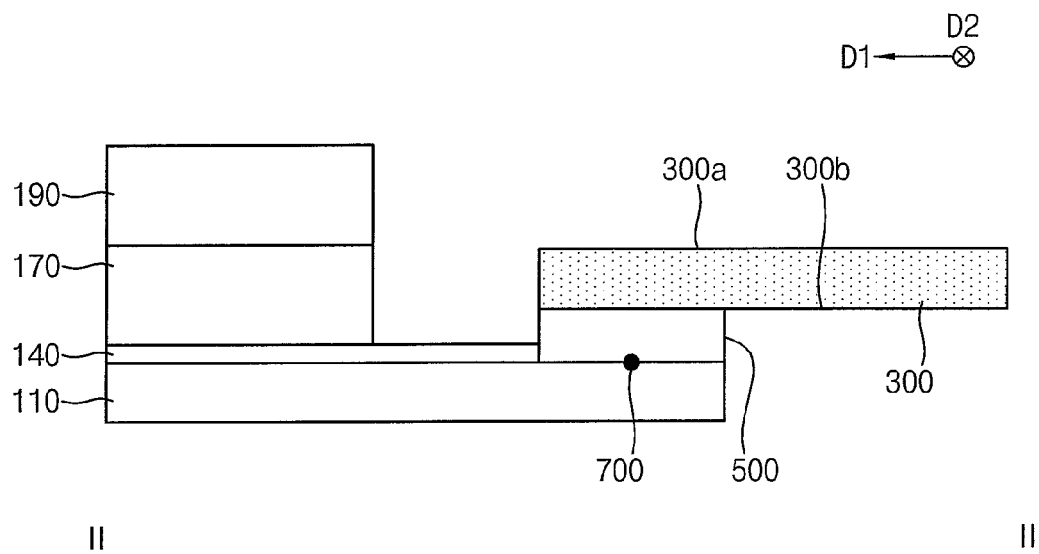

Referring to FIGS. 3, 4, 5, and 12, to manufacture a display device 20, after checking the particle 700 or 710 positioned or disposed between the display panel 100 and the connecting member 300, it may be determined whether the particle 700 overlaps two adjacent pads among the pads 130 (S110). In an embodiment, the particle 710 may be positioned or disposed between the connecting member 300 and the adhesive member 500 as shown in FIG. 4. In an embodiment, the particle 700 may be positioned or disposed between the adhesive member 500 and the display panel 100 as shown in FIG. 5. Whether the particle 700 overlaps the two adjacent pads among the pads 130 may be determined according to whether a defect occurs. For example, when both the third and fourth signals are provided to the fourth pad 134, or when both the third and fourth signals are provided to the third pad 133, it may be determined that the particle 700 overlaps the two adjacent pads among the pads 130. However, a method of determining whether the particle 700 overlaps two adjacent pads among the pads 130 is not limited thereto.

Referring to FIGS. 3, 6, 7, 8, and 12, a laser 910 may be irradiated to the upper surface 300a of the connecting member 300 overlapping at least a part of the particle 700 (S130). In detail, each of the pads 130 may be arranged or disposed to be spaced apart from each other with the constant width along the second direction D2 in a plan view. Accordingly, spaces spaced apart from each other in the second direction D2 between the pads 130 may be defined. The particle 700 may overlap the third and fourth pads 133 and 134, which may be located or disposed adjacent to each other, among the pads 130. In other words, the particle 700 may be positioned or disposed in the space where the two adjacent pads may be spaced apart from each other. For example, the laser 910 may be irradiated to the upper surface 300a overlapping the particle 700 positioned or disposed in the space.

Since the laser 910 has a relatively short wavelength, materials overlapping a region to which the laser 910 is irradiated may be removed. In an embodiment, the laser 910 may be a femtosecond laser, by way of example. However, the disclosure is not limited thereto. The laser 910 may have a wavelength in a range of about 300 nm to about 350 nm. For example, the laser 910 may have a wavelength of about 343 nm. However, a wavelength of the laser 910 is not limited to the above-described range, and the wavelength of the laser 910 may be appropriately selected according to materials of components included in the display device 20.

Figure 6:
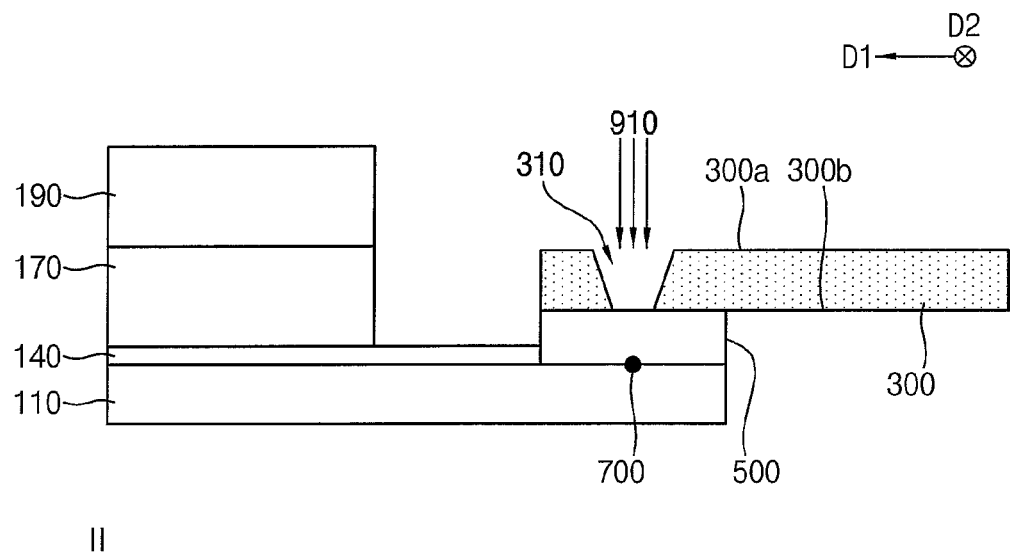
Figure 7:
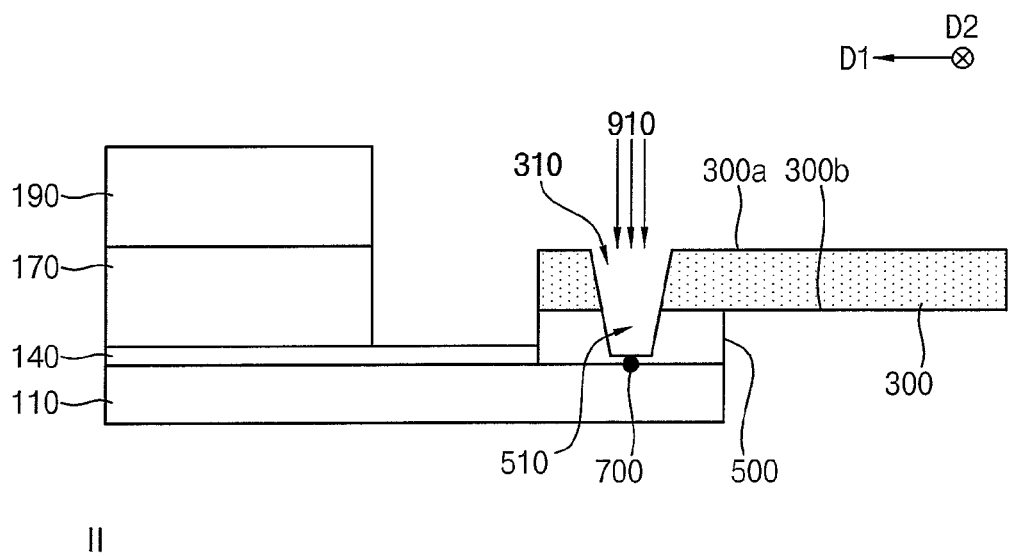
Figure 8:
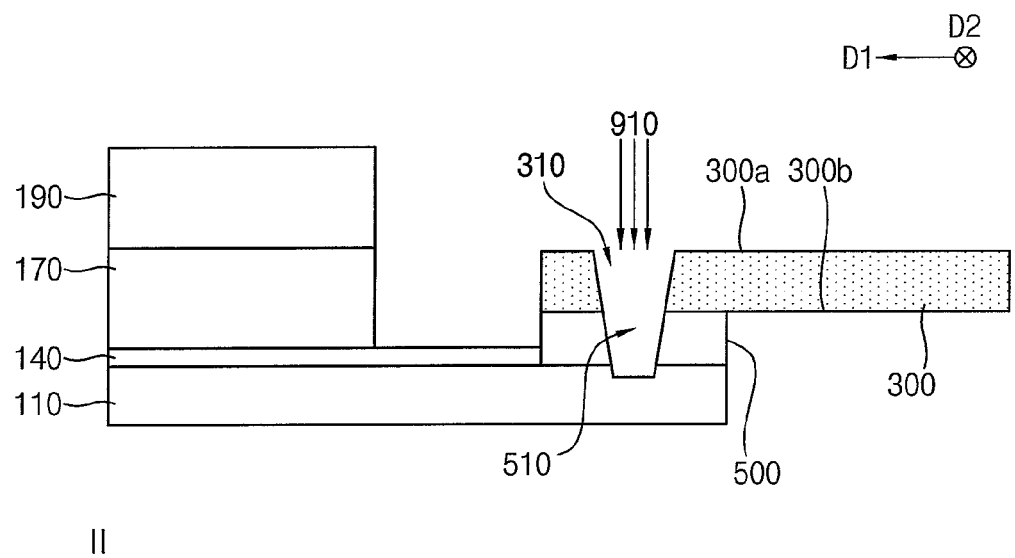

Since the laser 910 is irradiated, the connecting member 300, the adhesive member 500, and the particle 700 which may overlap the region to which the laser 910 may be irradiated may be removed (S150 and S170). In detail, as shown in FIG. 6, the connecting member 300 overlapping the region to which the laser 910 may be irradiated may be removed by irradiating the laser 910 with a first output. Accordingly, a first hole 310 may be formed. In other words, the first hole 310 may be formed in at least one of the even-numbered regions among the first to (n)th regions included in the first substrate 110. Subsequently, as shown in FIG. 7, the adhesive member 500 exposed by the first hole 310 may be removed by irradiating the laser 910 with a second output. Accordingly, a second hole 510 may be formed. Therefore, the second hole 510 may be connected to the first hole 310. In an embodiment, the second output may be the same as the first output. For example, the connecting member 300 may be removed together with the adhesive member 500. Subsequently, as shown in FIG. 8, the particle 700 overlapping the first and second holes 310 and 510 may be removed by irradiating the laser 910 with a third output. In an embodiment, the third output may be smaller than the first output and the second output. For example, the first output and the second output may be about 100 W or more, and the third output may be below or less than about 100 W.

After removing the connecting member 300, the adhesive member 500, and the particle 700 which may overlap the region to which the laser may be irradiated, whether the particle 700 positioned or disposed at the region to which the laser 910 may be irradiated may be removed may be checked (S190). In a case that the particle 700 is not removed, the laser 910 may be re-irradiated. For example, a case that the particle 700 is not removed may mean a case that the short between two adjacent pads still occurs because a part of the particle 700 remains. In an embodiment, since the laser 910 is re-irradiated, the part of the particle 700 may be removed.

Figure 9:
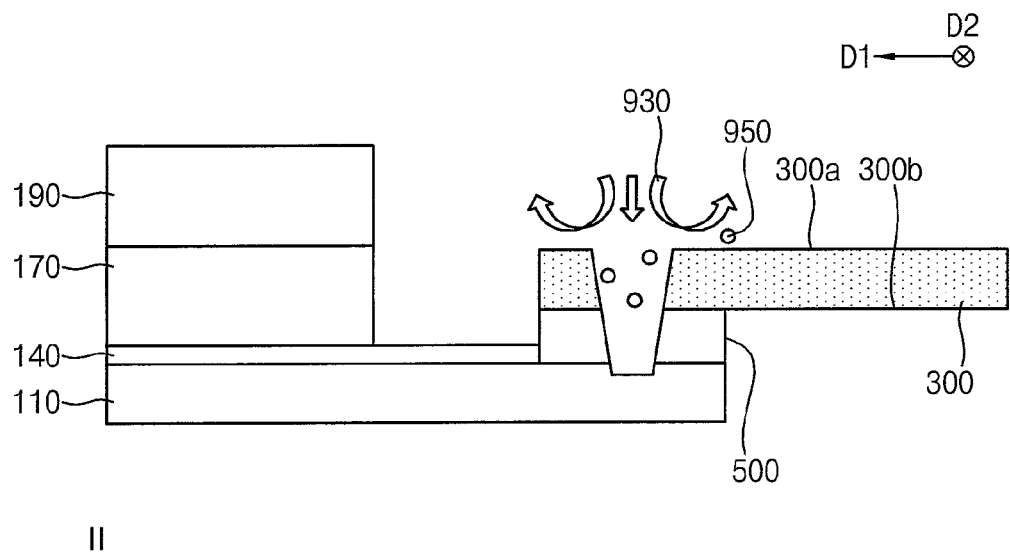
Figure 10A:
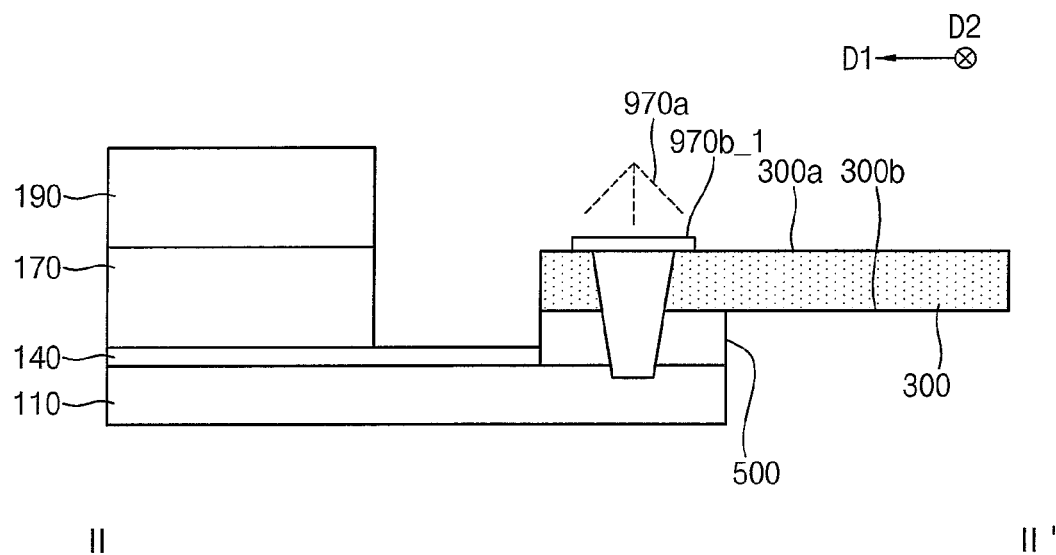
Figure 10B:
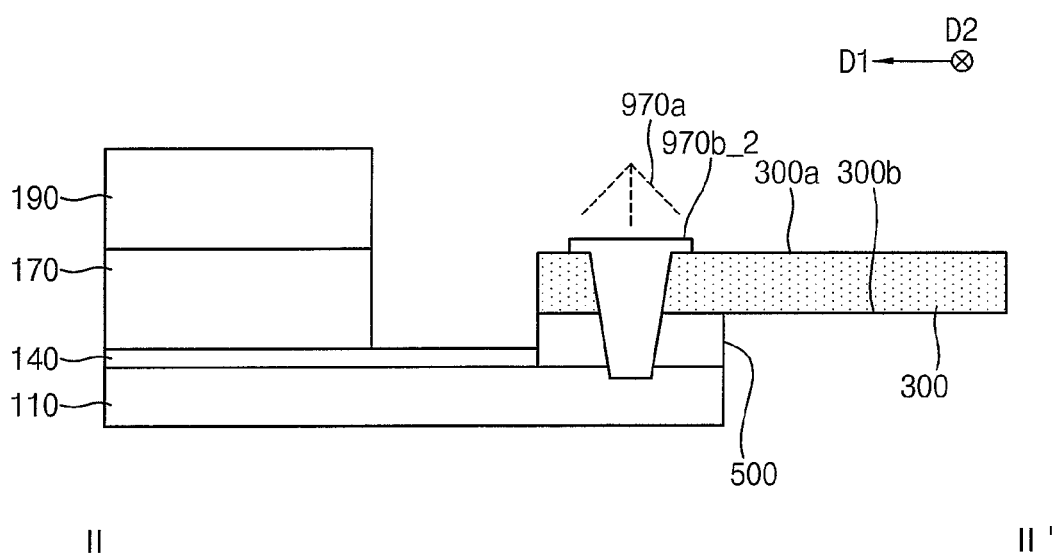
Figure 11A:
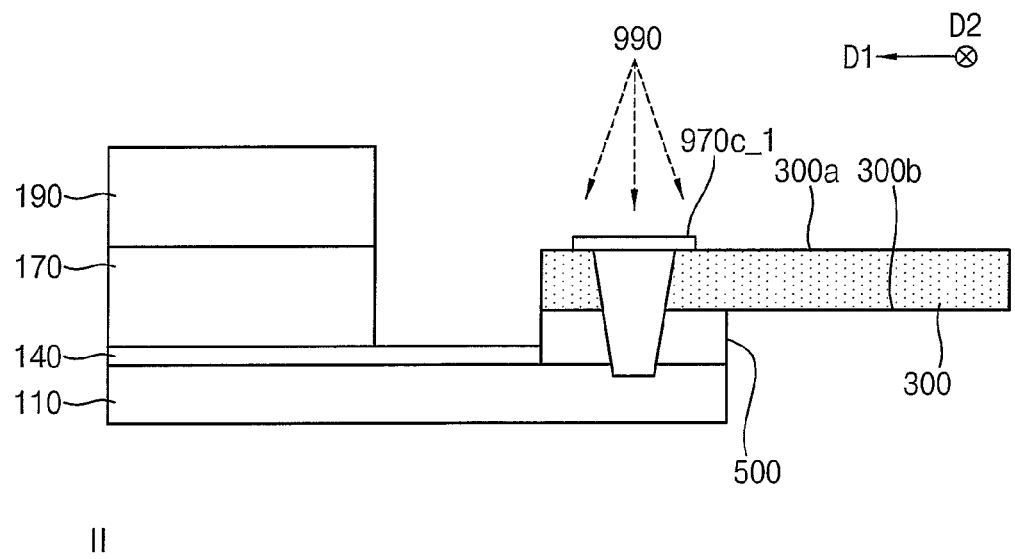
Figure 11B:
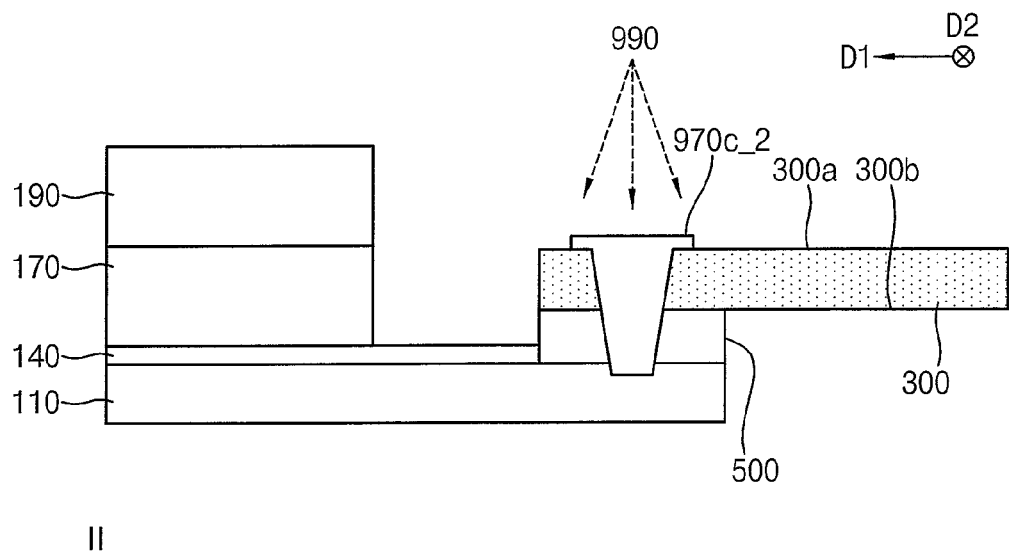

Referring to FIGS. 3, 9 and 12, after removing the connecting member 300, the adhesive member 500, and the particle 700 which may overlap the region to which the laser 910 may be irradiated, air 930 may be injected to the first and second holes 310 and 510 formed by removing the connecting member 300, the adhesive member 500, and the particle 700 (S210). For example, a fragment 950 of the particle 700 may remain inside and/or around the first and second holes 310 and 510. The fragment 950 may be removed by injecting air 930 to the first and second holes 310 and 510.

Referring to FIGS. 3, 10A, 10B, and 12, after injecting air 930 to the first and second holes 310 and 510, a desiccant 970a may be coated to the first and second holes 310 and 510 (S230). For example, the desiccant 970a may prevent the penetration of air and moisture. In an embodiment, the desiccant 970a may be coated by a spray method. Accordingly, a desiccant layer 970b_1 that may completely cover or overlap an upper surface of the first hole 310 may be formed. In other words, insides of the first and second holes 310 and 510 may be empty. On the other hand, the desiccant member 970b_2 filled in the insides of the first and second holes 310 and 510 may be formed.

Referring to FIGS. 3, 11A, 11B, and 12, after coating the desiccant 970a to the first and second holes 310 and 510, an ultraviolet-ray 990 may be irradiated to the desiccant layer 970b_1 (S250). In an embodiment, since the ultraviolet-ray 990 is irradiated to the desiccant layer 970b_1, a cured desiccant layer 970c_1 that may completely cover or overlap the upper surface of the first hole 310 may be formed. Accordingly, the insides of the first and second holes 310 and 510 may be empty. In an embodiment, since the ultraviolet-ray 990 is irradiated to the desiccant member 970b_2, a cured desiccant member 970c_2 filling the insides of the first and second holes 310 and 510 may be formed.

Meanwhile, in an embodiment, when the desiccant 970a includes a material that cures over time, a process of irradiating ultraviolet-ray 990 may be omitted. In an embodiment, after removing the connecting member 300, the adhesive member 500, and the particle 700 which may overlap the region to which the laser may be irradiated, a heat may be applied to a periphery of the region. Since the heat is applied, a periphery of a portion where the connecting member 300, the adhesive member 500, and the particle 700 are removed may be melted and cured so that the penetration of air and moisture may be prevented.

Referring to FIG. 12, the display device 20 may not include the particle 700 overlapping two adjacent pads. In an embodiment, since the laser 910 is irradiated to the particle 700 overlapping the third and fourth pads 133 and 134, the particle 700 overlapping the third and fourth pads 133 and 134 may be removed. Accordingly, the short between the third and fourth pads 133 and 134 may be prevented. For example, the third signal provided from the connecting member 300 to the third pad 133 may not be provided to the fourth pad 134 and the fourth wire 154. In other words, the fourth signal provided from the connecting member 300 to the fourth pad 134 may not be provided to the third pad 133 and the third wire 153.

According to a method of manufacturing the display device 20 according to an embodiment, since the laser 910 is irradiated to the upper surface 300a of the connecting member 300, the particle 700 may be removed. Accordingly, the laser 910 may not transmit through the first substrate 110. Therefore, the wavelength of the laser 910 may not be limited to a wavelength in a range for transmitting through the first substrate 110. The laser 910 may be irradiated to the upper surface 300a of the connecting member 300. Therefore, the laser 910 may be irradiated to the particle 700 regardless of a structure of the display device 20.

According to the above-described, an embodiment in which the particle 700 may be positioned between the adhesive member 500 and the display panel 100 are mainly described, but the disclosure is not limited thereto. For example, even when the particle 710 may be positioned or disposed between the connecting member 300 and the adhesive member 500, the particle 710 may be removed through the above-described method.

Figure 13:
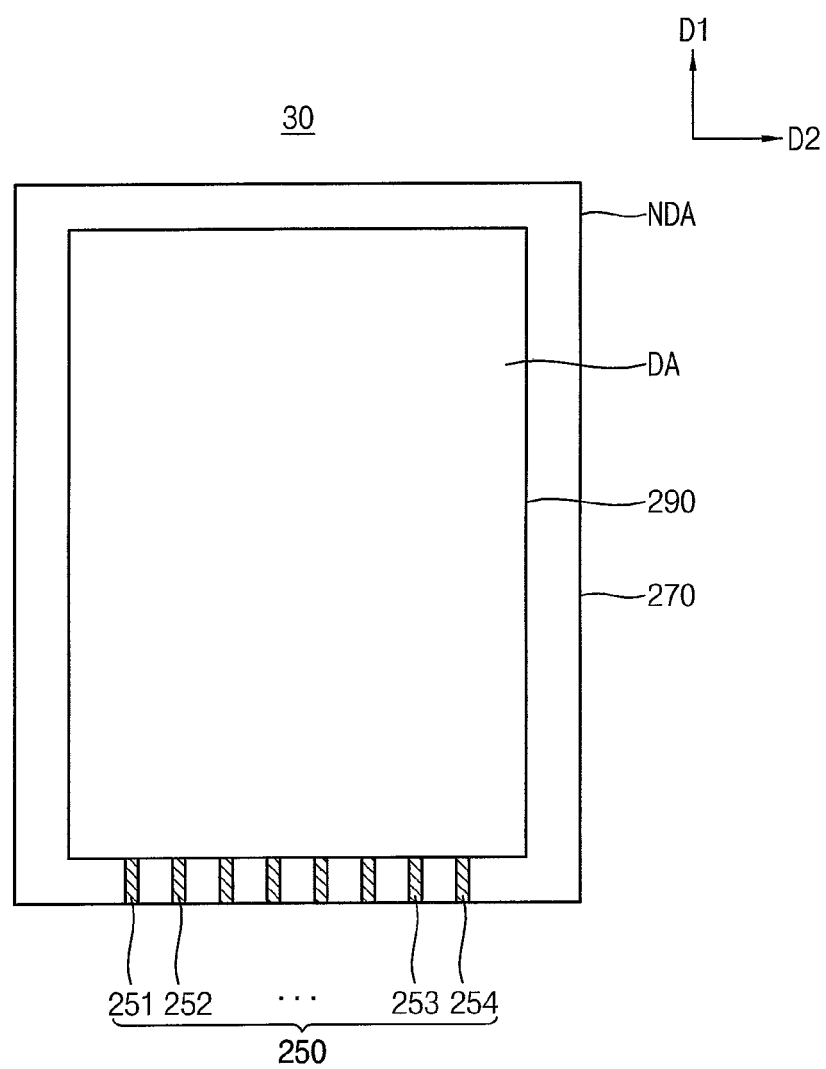
FIG. 13 is a plan view illustrating a display device according to an embodiment.
Figure 14:
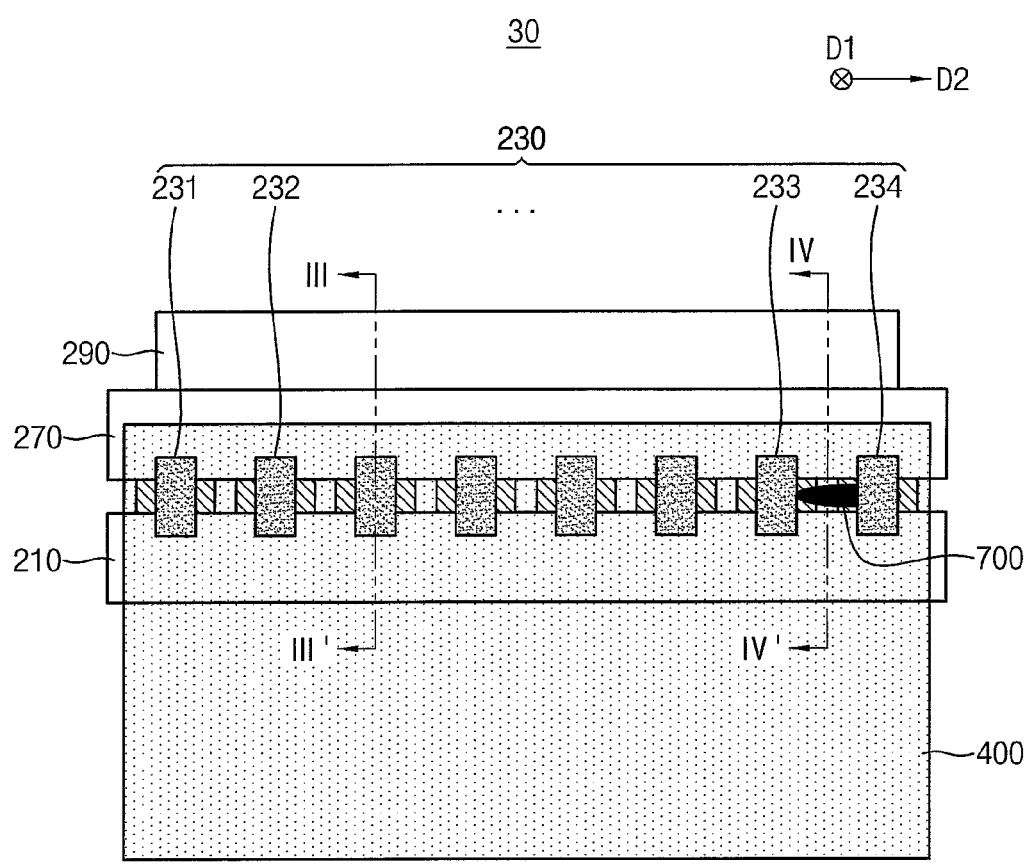
FIG. 14 is a side view illustrating area A of FIG. 13.
Figure 15:
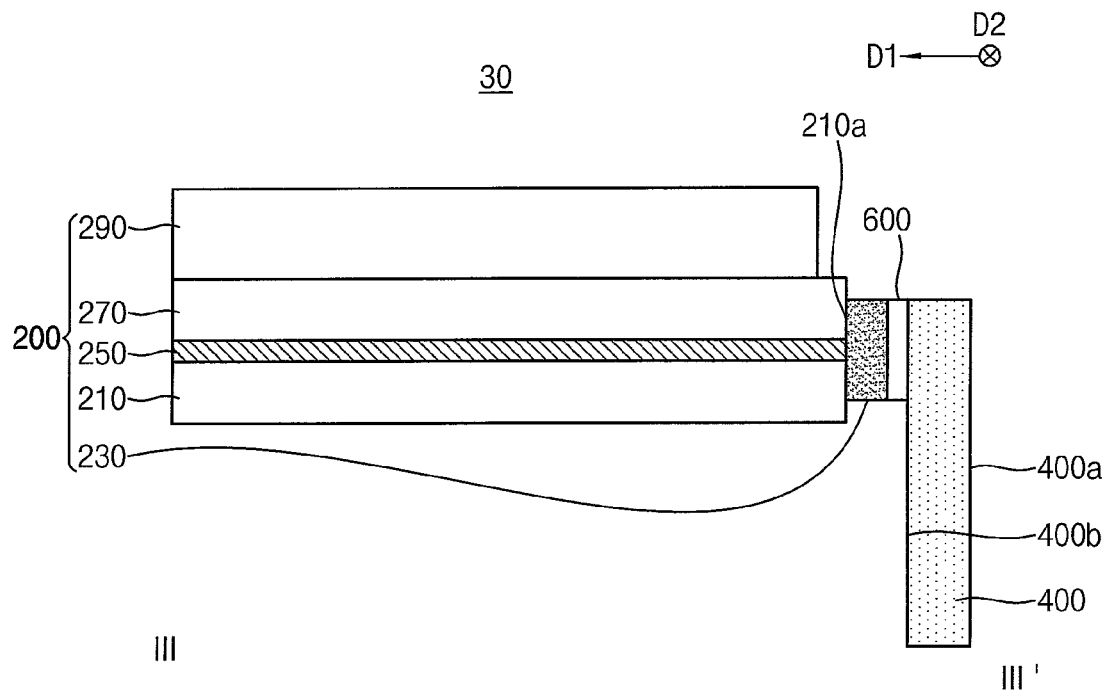
FIG. 15 is a schematic cross-sectional view taken along line of FIG. 14.
Figure 16:
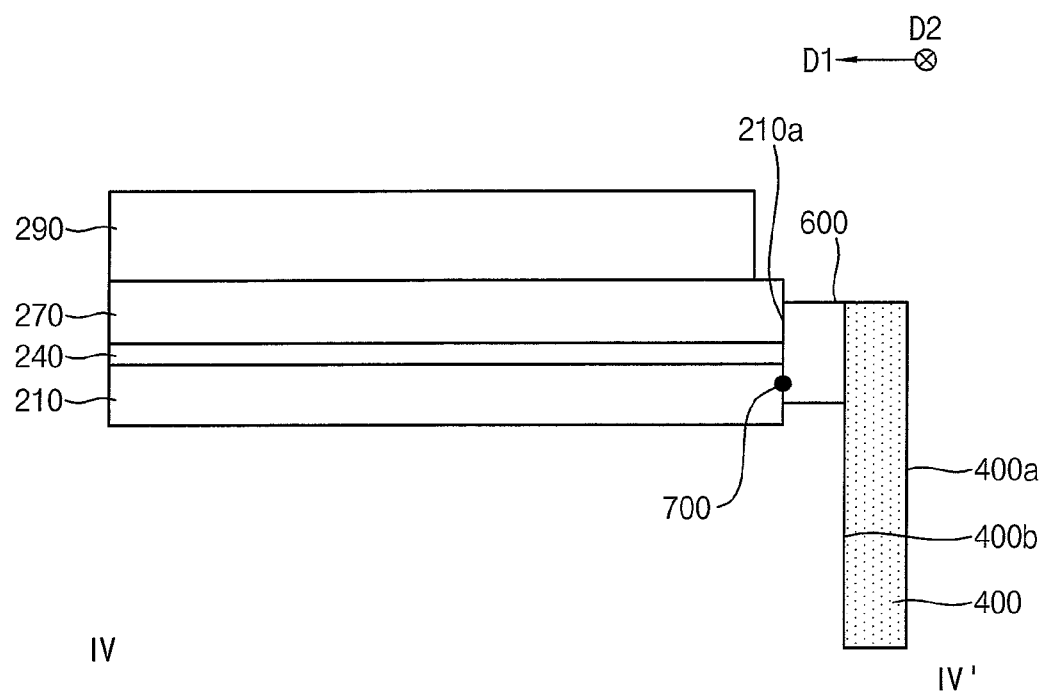
FIG. 16 to FIG. 22 are schematic cross-sectional views illustrating a method of manufacturing a display device according to an embodiment.
Figure 17:
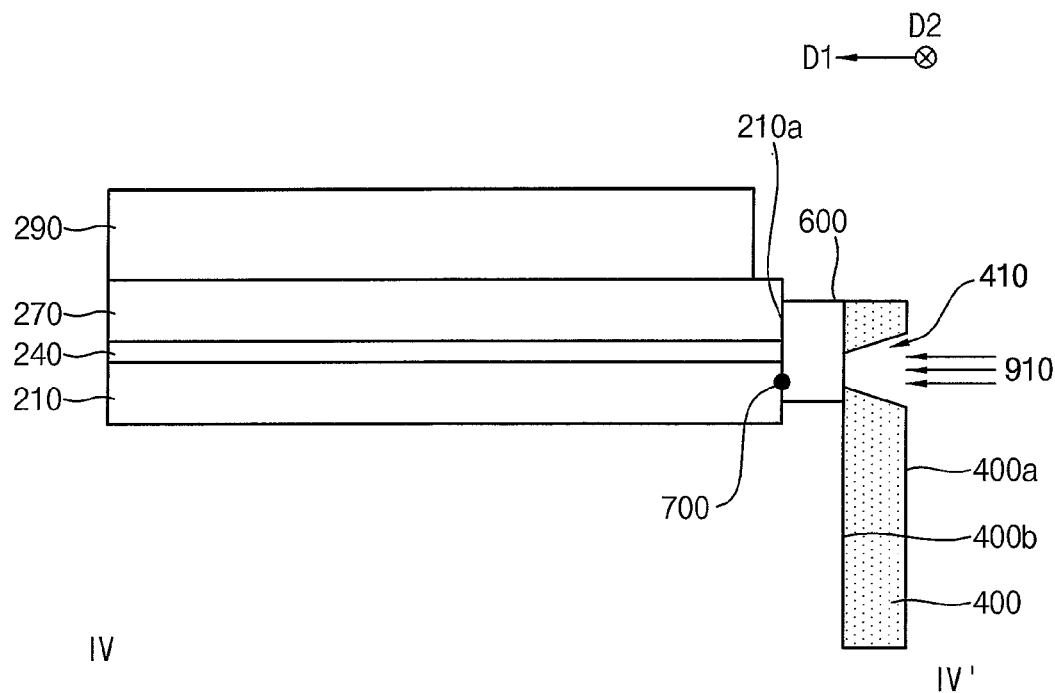
Figure 18:
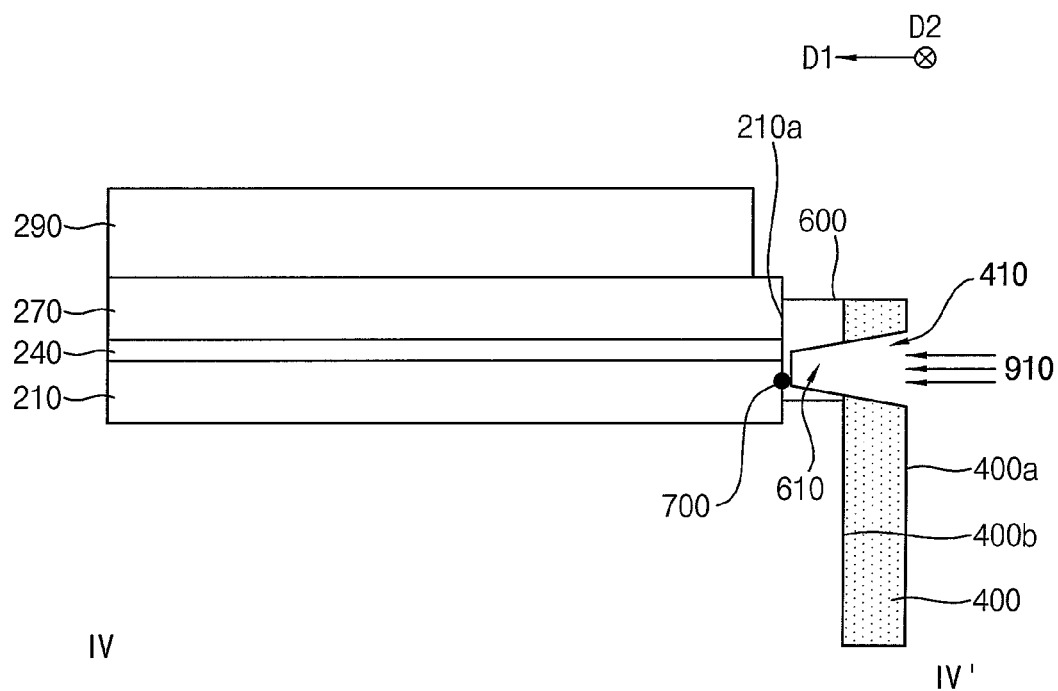
Figure 19:
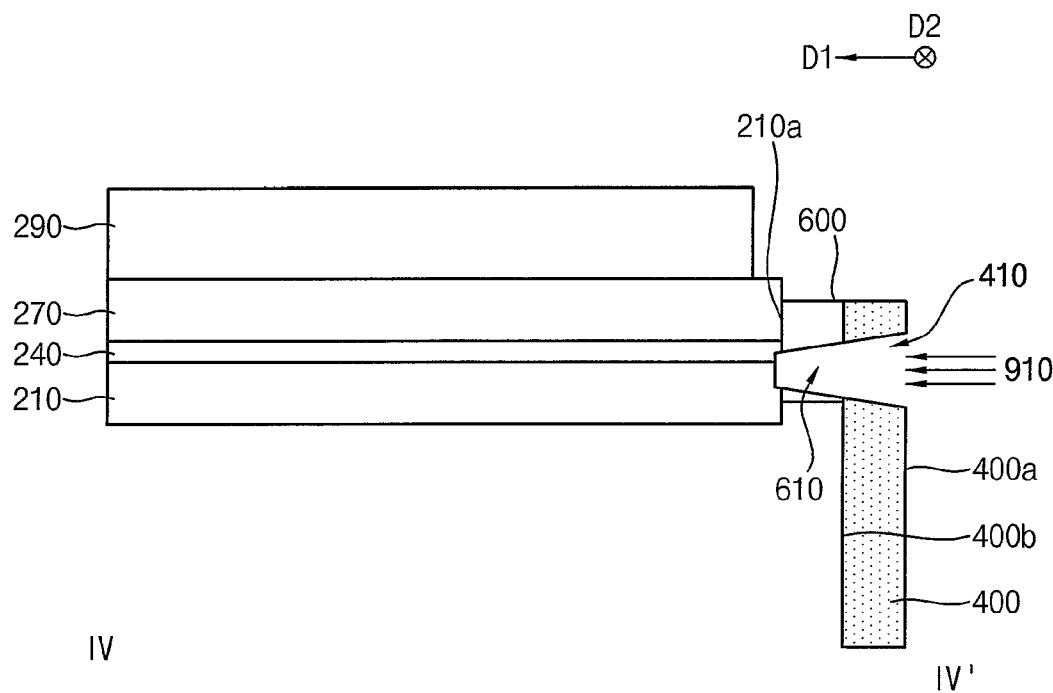

FIG. 13 is a plan view illustrating a display device according to an embodiment, FIG. 14 is a side view illustrating area A of FIG. 13, and FIG. 15 is a schematic cross-sectional view taken along line of FIG. 14.

Referring to FIGS. 13, 14, and 15, the display device 30 may include a display panel 200, a connecting member 400 and an adhesive member 600. The display panel 200 may include a first substrate 210, pads However, since the wires 250 and a polarizing plate 290 may be substantially the same as the wires 150 and the polarizing plate 190 of the display device 10 or 20 described above, the first substrate 210, the pads 230, the second substrate 270, the connecting member 400, and the adhesive member 600 will be described below. The wires 250 may include first to fourth wires 251, 252, 253 and 254.

The first substrate 210 may include a transparent material or an opaque material. For example, the first substrate 210 may include a quartz substrate, or a glass substrate. On the other hand, the first substrate 210 may include a plastic substrate having flexibility.

The second substrate 270 may be disposed on the first substrate 210. For example, the second substrate 270 may be disposed to face the first substrate 210. The second substrate 270 may include glass, quartz, plastic, or the like, by way of example. For example, in a case that the display device 30 is a liquid crystal display ("LCD"), a liquid crystal layer may be disposed between the first substrate 210 and the second substrate 270. On the other hand, when the display device 30 is an organic light emitting display, an organic light emitting diode ("OLED") may be disposed between the first substrate 210 and the second substrate 270.

For example, the second substrate 270 may be a color filter substrate. The second substrate 170 may include color filters, and each of the color filters may be a wavelength selective optical filter that may selectively transmit only a portion of a wavelength band of a light incident to each color filter by transmitting a light in a specific wavelength band and blocking the light in another specific wavelength band. For example, the color filters may include a red color filter, a green color filter, and a blue color filter.

The pads 230 may be disposed on side surfaces 210a of the first and second substrates 210 and 270. The pads 230 may include first to fourth pads 231, 232, 233 and 234. For example, each of the pads 230 may be arranged or disposed to be spaced apart from each other with a constant width along the second direction D2 in a plan view. In other words, the first substrate 210 may include first to (n)th regions along the second direction D2, and the pads 230 may be disposed in odd-numbered regions among the first to (n)th regions. The signal from the connecting member 400 may be provided to the pads 230.

The connecting member 400 may be disposed on the side surfaces 210a of the first and second substrates 210 and 270. The connecting member 400 may include an upper surface 400a and a rear surface 400b. The rear surface 400b may face the side surfaces 210a of the first and second substrates 210 and 270 with the pads 230 interposed or disposed therebetween. The upper surface 400a of the connecting member 400 may be parallel to the side surfaces 210a of the first and second substrates 210 and 270.

The connecting member 400 may be electrically connected to the pads 230. In detail, the connecting member 400 may provide the signals generated from the external device to the pads 230. For example, circuit patterns may be formed or disposed on the connecting member 400.

The adhesive member 600 may be disposed between the pads 230 and the connecting member 400. The adhesive member 600 may include a conductive material. Accordingly, the adhesive member 600 may transfer the signal from the connecting member 400 to the pads 230. In an embodiment, the adhesive member 600 may be an anisotropic conducting film.

Meanwhile, the particle 700 may be positioned or disposed between the display panel 200 and the connecting member 400. The particle 700 may be a piece that may be separated from the pads 230 during a process of patterning the pads 230, or may penetrate from an outside of the display device 30 during a process of manufacturing the display device 30. For example, the particle 700 may include a conductive material. As the particle 700 includes the conductive material, the particle 700 may have a conductivity. For example, when the particle 700 overlaps two adjacent pads among the pads 230, a short may occur between the two adjacent pads. Here, the particle 700 may overlap the two adjacent pads in a plan view. For example, as shown in FIG. 14, the particle 700 may overlap the third and fourth pads 233 and 234.

In a case that the display device 30 includes the particle 700 as described above, the short may occur between pads overlapping the particle 700. Accordingly, the signals may not be provided to the pads where the short may occur. For example, since the particle 700 may be positioned or disposed between the third and fourth pads 233 and 234, a defect in which third and fourth signals are provided to the third pad 233 may occur, or a defect in which the third and fourth signals are provided to the fourth pad 234 may occur.

Figure 21:
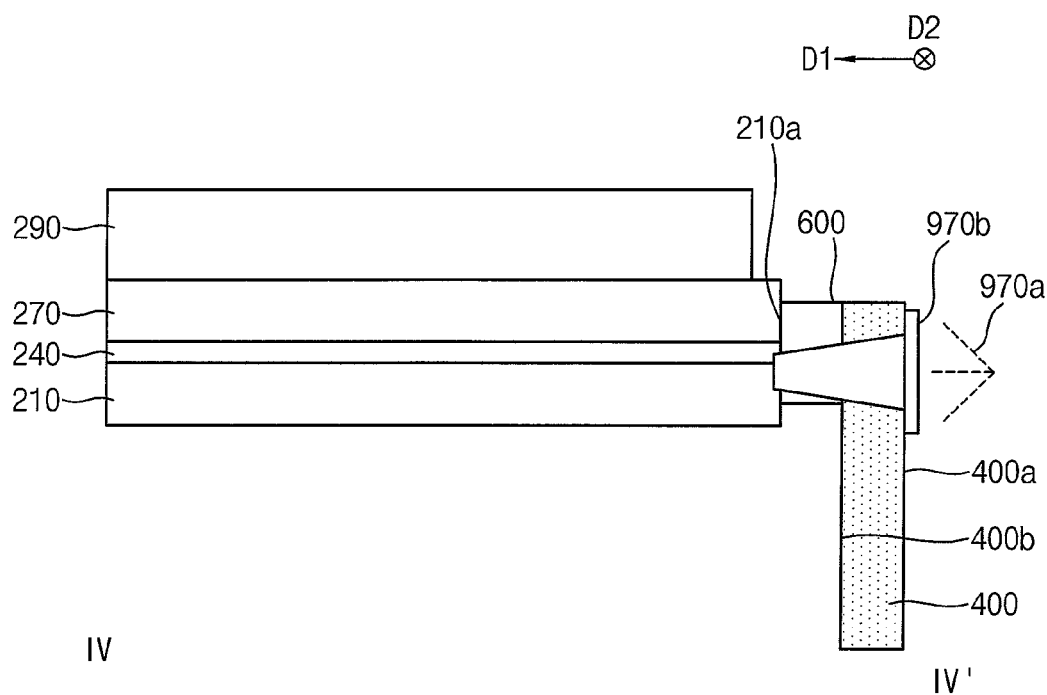
Figure 22:
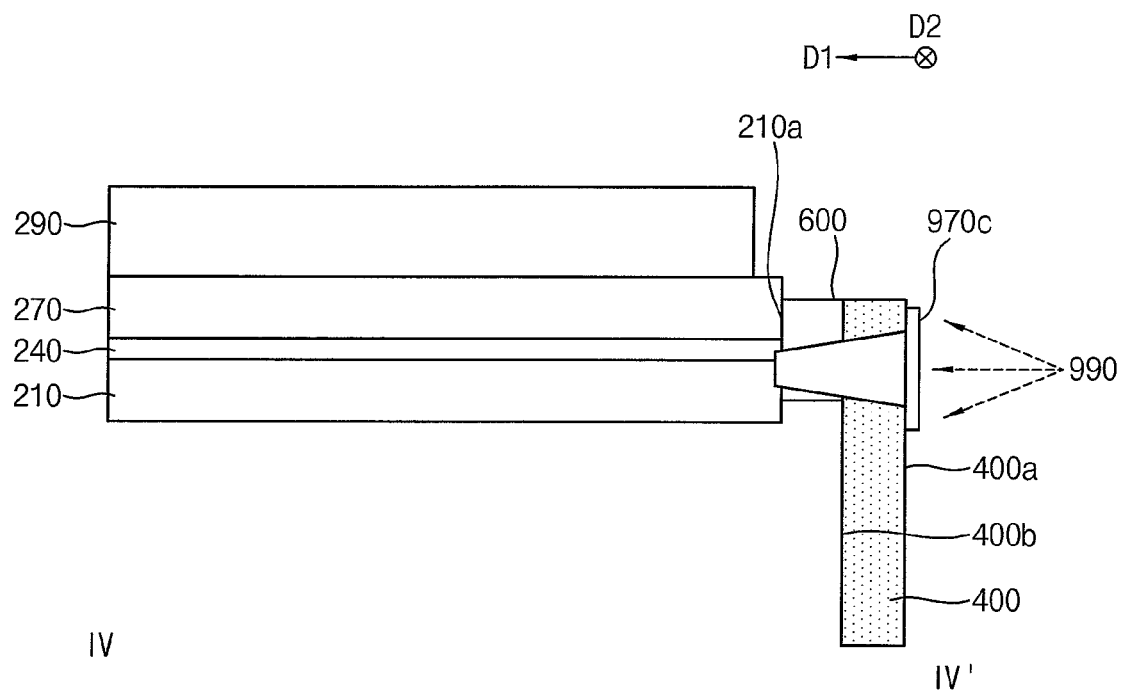
Figure 23:
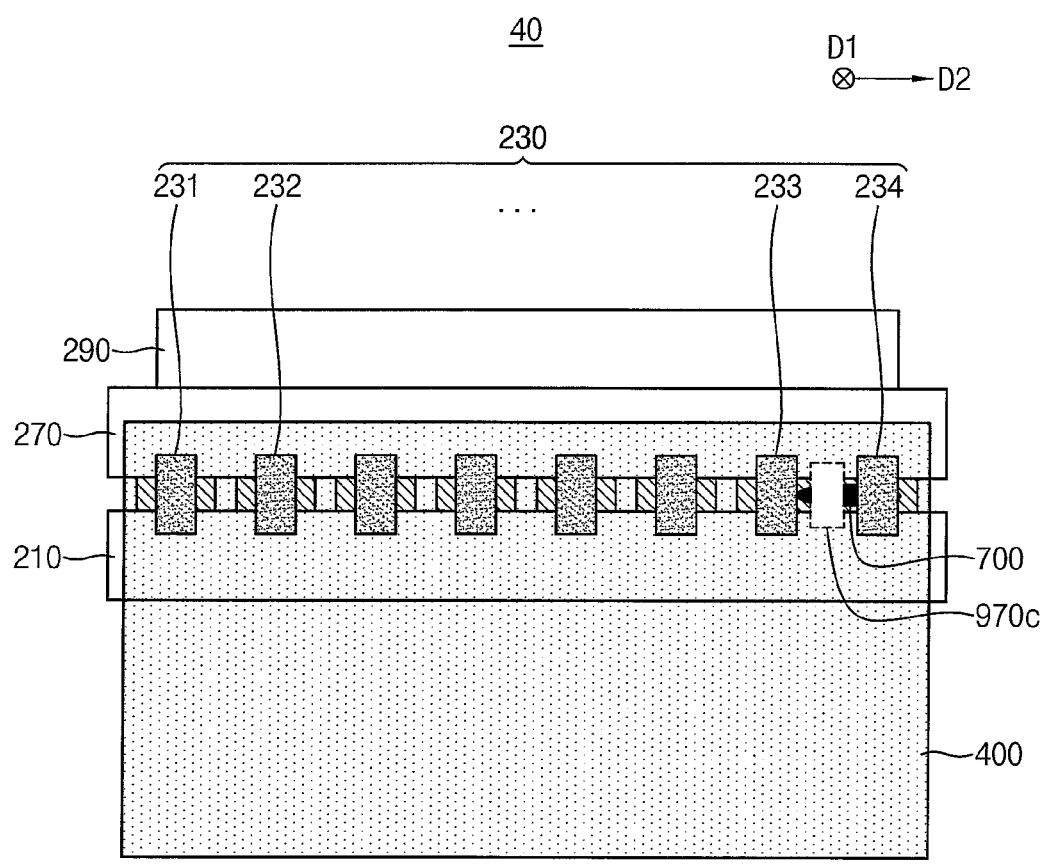
FIG. 23 is a side view illustrating a display device according to an embodiment.

FIG. 16 to FIG. 22 are schematic cross-sectional views illustrating a method of manufacturing a display device according to an embodiment. FIG. 23 is a side view illustrating a display device according to an embodiment. For example, FIG. 16 to FIG. 22 are schematic cross-sectional views taken along line IV-IV' of FIG. 14.

Referring to FIGS. 3, 14, 16, and 23, to manufacture a display device 40, after checking the particle 700 positioned or disposed between the display panel 200 and the connecting member 400, it may be determined whether the particle 700 overlaps two adjacent pads among the pads 230 (S110). The display device 40 may include an insulating portion 240 disposed between the first 210 and second substrates 270.

Referring to FIGS. 3, 14, 17, 18, 19, and 23, a laser 910 may be irradiated to the upper surface 400a of the connecting member 400 overlapping at least a part of the particle 700 (S130). Since the laser 910 has a relatively short wavelength, materials overlapping the region to which the laser 910 may be irradiated may be removed.

Since the laser 910 is irradiated, the connecting member 400, the adhesive member 600, and the particle 700 which may overlap the region to which the laser 910 may be irradiated may be removed (S150 and S170). Accordingly, a first hole 410 may be formed in the connecting member 400, and a second hole 610 may be formed in the adhesive member 600. In other words, the first hole 410 may be formed in at least one of the even-numbered regions among the first to (n)th regions included in the first substrate 210.

After removing the connecting member 400, the adhesive member 600 and the particle 700 which may overlap the region to which the laser may be irradiated, whether the particle 700 positioned or disposed at the region to which the laser 910 may be irradiated may be removed may be checked (S190).

Figure 20:
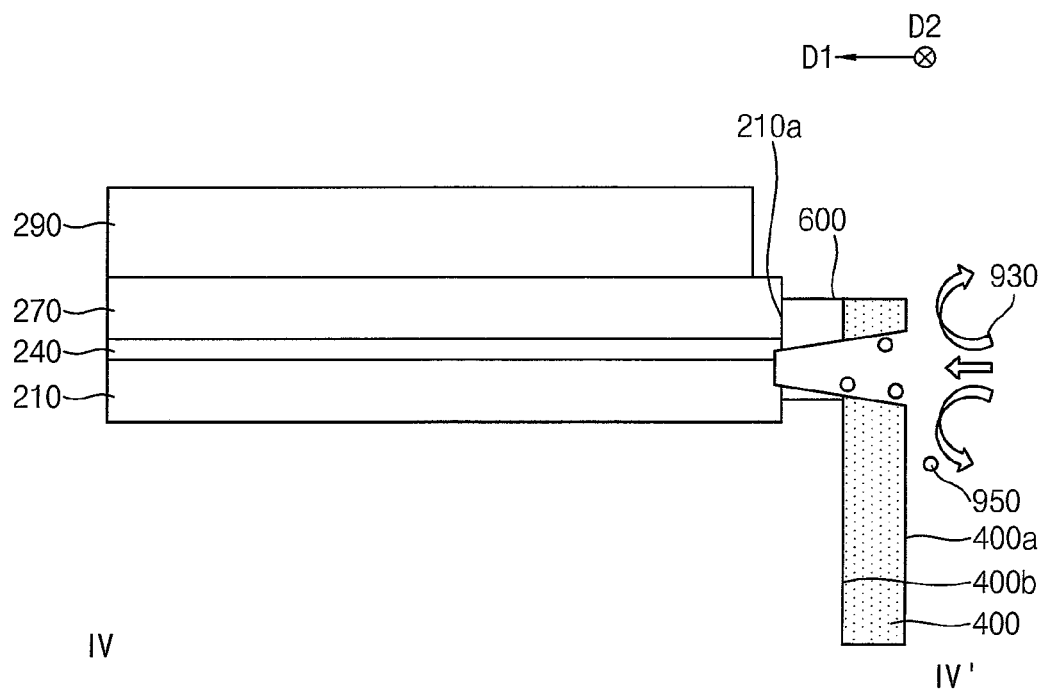

Referring to FIGS. 3, 20, and 23, after removing the connecting member 400, the adhesive member 600, and the particle 700 which may overlap the region to which the laser 910 may be irradiated, air 930 may be injected to the first and second holes 410 and 610 formed by removing the connecting member 400, the adhesive member 600, and the particle 700 (S210).

Referring to FIGS. 3, 21, and 23, after injecting the air 930 to the first and second holes 410 and 610, a desiccant 970a may be coated to the first and second holes 410 and 610 (S230). In an embodiment, the desiccant 970a may be coated by a spray method. Accordingly, a desiccant layer 970b_1 may be formed. FIGS. 21-23 may also include a desiccant layer 970b and cured desiccant layer 970c.

Referring to FIGS. 3, 22 and 23, after coating the desiccant 970a to the first and second holes 410 and 610, an ultraviolet-ray 990 may be irradiated to the desiccant layer 970b_1 (S250). Since the ultraviolet-ray 990 is irradiated to the desiccant layer 970b_1, a cured desiccant layer 970c_1 may be cured.

Referring to FIG. 23, since the display device 40 may include the pads 230 and the connecting member 400 which may be disposed on the side surfaces 210a of the first and second substrates 210 and 270, a non-display area NDA of the display device 40 may be reduced. Since the laser 910 is irradiated to the particle 700 between the third and fourth pads 233 and 234, the particle 700 between the third and fourth pads 233 and 234 may be removed. Accordingly, the short between the third and fourth pads 233 and 234 may be prevented. For example, the third signal provided from the connecting member 400 to the third pad 233 may not be provided to the fourth pad 234 and the fourth wire 254. In other words, the fourth signal provided from the connecting member 400 to the fourth pad 234 may not be provided to the third pad 233 and the third wire 253.

According to the method of manufacturing the display device 40 according to an embodiment, since the laser 910 is irradiated to the upper surface 400a of the connecting member 400, the particle 700 may be removed. Accordingly, the laser 910 may not transmit through the first and second substrates 210 and 270. Therefore, the wavelength of the laser 910 may not be limited to a wavelength in a range for transmitting through the first and second substrates 210 and 270. The laser 910 may be irradiated to the upper surface 410a of the connecting member 400. Therefore, the laser 910 may be irradiated to the particle 700 regardless of a structure of the display device 40.

The disclosure may be applied to a display device and an electronic device using the display device. For example, the disclosure may be applied to a cellular phone, a smart phone, a video phone, a smart pad, a smart watch, a tablet PC, a navigation system, a television, a computer monitor, a laptop, etc. within the spirit and the scope of the disclosure.

The foregoing is illustrative of embodiments and is not to be construed as limiting thereof. Although a embodiments have been described, those skilled in the art will readily appreciate that many modifications are possible without materially departing from the novel teachings and advantages of the disclosure. Accordingly, all such modifications are intended to be included within the scope of the disclosure as defined in the claims. Therefore, it is to be understood that the foregoing is illustrative of various embodiments and is not to be construed as limited to the embodiments disclosed, and that modifications to the disclosed embodiments, as well as other embodiments, are intended to be included within the scope of the appended claims.

What is claimed is:

1. A display device comprising:
    a first substrate including a plurality of regions;
    pads disposed on the first substrate and disposed in odd-numbered regions among the plurality of the regions;
    a connecting member disposed on the pads and including a first hole formed in at least one of even-numbered regions among the plurality of the regions;
    an adhesive member disposed between the pads and the connecting member and including a second hole connected to the first hole; and
    a desiccant disposed on the first hole.

2. The display device of claim 1, wherein
    the desiccant completely covers an upper surface of the first hole, and
    insides of the first and second holes are empty.

3. The display device of claim 1, wherein
    the desiccant completely covers an upper surface of the first hole, and
    the desiccant is filled in the first and second holes.

4. The display device of claim 1, further comprising:
a second substrate facing the first substrate, wherein
the pads are disposed on side surfaces of the first and second substrates, and
the side surfaces of the first and second substrates and an upper surface of the connecting member are parallel to each other.

\* \* \* \* \*